(12) United States Patent
Bussey et al.

(10) Patent No.: US 12,289,135 B2
(45) Date of Patent: Apr. 29, 2025

(54) ELECTROMAGNETIC FIELD DETECTOR

(71) Applicant: British Telecommunications Public Limited Company, London (GB)

(72) Inventors: Liam Bussey, London (GB); Amelia Lees, London (GB); Fraser Burton, London (GB); Marco Menchetti, London (GB); Timothy Whitley, London (GB)

(73) Assignee: BRITISH TELECOMMUNICATIONS PUBLIC LIMITED COMPANY, London (GB)

( * ) Notice: Subject to any disclaimer, the term of this patent is extended or adjusted under 35 U.S.C. 154(b) by 0 days.

(21) Appl. No.: 18/863,938

(22) PCT Filed: Apr. 11, 2023

(86) PCT No.: PCT/EP2023/059390
§ 371 (c)(1),
(2) Date: Nov. 7, 2024

(87) PCT Pub. No.: WO2023/217473
PCT Pub. Date: Nov. 16, 2023

(65) Prior Publication Data
US 2025/0112709 A1    Apr. 3, 2025

(30) Foreign Application Priority Data
May 13, 2022    (EP) .................................. 22173349

(51) Int. Cl.
*H04B 10/70*    (2013.01)
*G01R 29/08*    (2006.01)
*H04B 10/60*    (2013.01)

(52) U.S. Cl.
CPC .......... *H04B 10/70* (2013.01); *G01R 29/0885* (2013.01); *H04B 10/60* (2013.01); *H04B 2210/006* (2013.01)

(58) Field of Classification Search
CPC ..... H04B 10/70; H04B 10/60; G01R 29/0885
(Continued)

(56) References Cited

U.S. PATENT DOCUMENTS

| 4,024,396 A | 5/1977 | Hill et al. |
| 10,256,917 B2 * | 4/2019 | Dolgin ............... H04B 10/5561 |

(Continued)

FOREIGN PATENT DOCUMENTS

| CN | 110401492 A | * 11/2019 |
| CN | 111490825 A | 8/2020 |

(Continued)

OTHER PUBLICATIONS

Nina et al; Controlled multi-photon subtraction with cascaded Rydberg super atoms as single-photon absorbers; 2021; pp. 1-8. (Year: 2021).*

(Continued)

*Primary Examiner* — Amritbir K Sandhu
(74) *Attorney, Agent, or Firm* — Nixon & Vanderhye P.C.

(57) ABSTRACT

This invention provides a method of detecting a photon in a first frequency range, the method comprising the steps of: exciting a first transmission medium by a first probe signal at a first probe frequency, wherein the first probe signal excites electrons of the first transmission medium from a ground state of the first transmission medium to a first excited state of the first transmission medium; exciting the first transmission medium by a first coupling signal at a first coupling frequency, wherein the first coupling signal overlaps with the first probe signal in the first transmission (Continued)

medium and excites electrons of the first transmission medium to a predetermined excited state of the first transmission medium such that a first photon in the first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron from the further excited state of the first transmission medium; detecting the first photon in the first frequency range and having the first polarisation by detecting the first photon in the second frequency range; exciting a second transmission medium by a second probe signal at a second probe frequency, wherein the second probe signal excites electrons of the second transmission medium from a ground state of the second transmission medium to a first excited state of the second transmission medium; exciting the second transmission medium by a second coupling signal at a second coupling frequency, wherein the second coupling signal overlaps with the second probe signal in the second transmission medium and excites electrons of the second transmission medium to a predetermined excited state of the second transmission medium such that a second photon in the first frequency range incident upon the second transmission medium and having a second polarisation excites an electron in the predetermined excited state of the second transmission medium to a further excited state of the second transmission medium, wherein a second photon in the second frequency range is emitted as part of a subsequent deexcitation of the electron in the further excited state of the second transmission medium; and detecting the second photon in the first frequency range having the second polarisation by detecting the second photon in the second frequency range. This invention also provides a detector and system for implementing said method.

13 Claims, 4 Drawing Sheets

(58) Field of Classification Search
USPC .......................................................... 398/40
See application file for complete search history.

(56) References Cited

U.S. PATENT DOCUMENTS

| | | | | |
|---|---|---|---|---|
| 10,763,966 | B1* | 9/2020 | Deb | H04B 10/25759 |
| 11,349,569 | B2* | 5/2022 | Graceffo | H04B 10/40 |
| 12,028,111 | B1* | 7/2024 | Bussey | H04B 10/40 |
| 2014/0210473 | A1* | 7/2014 | Campbell | G01R 33/60 |
| | | | | 324/318 |
| 2015/0042327 | A1* | 2/2015 | Bulatowicz | G01R 33/26 |
| | | | | 324/304 |
| 2022/0196716 | A1* | 6/2022 | Anderson | G01R 29/10 |
| 2022/0196719 | A1* | 6/2022 | Walker | G01R 29/12 |
| 2022/0294619 | A1* | 9/2022 | Menchetti | H04L 9/0858 |
| 2023/0261743 | A1* | 8/2023 | Burton | H04B 10/00 |
| | | | | 398/25 |
| 2024/0094275 | A1* | 3/2024 | Burton | G01R 29/0885 |

FOREIGN PATENT DOCUMENTS

| | | | | |
|---|---|---|---|---|
| CN | 112867934 | A | 5/2021 | |
| CN | 110231332 | B * | 1/2022 | G01N 21/65 |
| GB | 2588754 | | 5/2021 | |
| GB | 2588754 | A * | 5/2021 | G01R 29/0878 |
| WO | WO-2020192153 | A1 * | 10/2020 | G01J 3/0208 |

OTHER PUBLICATIONS

International Preliminary Report on Patentability dated Nov. 28, 2024, issued for International Application No. PCT/EP2023/059390 (7 pages).
International Search Report and Written Opinion of the ISA for PCT/EP2023/059390 dated Jul. 18, 2023, 12 pages.
Extended European Search Report for Application No. 22173349.6 dated Nov. 16, 2022, 11 pages.
Combined Search Report and Abbreviated Examination Report for GB Application No. 2207032.0 dated Nov. 11, 2022, 6 pages.
Intention to Grant under Section 18(4) for GB Application No. 2207032.0 dated Feb. 21, 2024, 2 pages.
Adams C S et al., "Rydberg atom quantum technologies", Journal of Physics B, Atomic Molecular and Optical Physics, vol. 53, No. 1, 2019, 24 pages.
J. Sedlacek et al., "Atom Based Vector Microwave Electrometry Using Rubidium Rydberg Atoms in a Vapor Cell", ResearchGate, University of Oklahoma, Apr. 15, 2013, 6 pages.
Christopher L. Holloway et al., "Detecting and Receiving Phase-Modulated Signals With a Rydberg Atom-Based Receiver", IEEE Antennas and Wireless Propagation Letters, vol. 18, No. 9, Sep. 2019, 5 pages.
Philippe Torchio et al., "High-reflectivity HfO2/SiO2 ultraviolet mirrors", Applied Optics, vol. 41, No. 16, Jun. 1, 2002, 7 pages.
Lucy A. Downes et al., "Ultra-high-speed Terahertz Imaging using Atomic Vapour", Durham University, Mar. 18, 2019, 9 pages.
Hamamatsu, Photomultiplier tubes (PMTs) dated Oct. 19, 2021 (4 pages).
First Notification of Office Action dated Jan. 17, 2025, issued for Chinese Application No. 202380037718.5 (9 pages).

* cited by examiner

ELECTROMAGNETIC FIELD DETECTOR

CROSS-REFERENCE TO RELATED APPLICATIONS

This application is the U.S. national phase of International Application No. PCT/EP2023/059390 filed Apr. 11, 2023 which designated the U.S. and claims priority to EP 22173349.6 filed May 13, 2022, the entire contents of each of which are hereby incorporated by reference.

FIELD OF THE INVENTION

The present invention relates to a method for detecting an electromagnetic field, and a detector and system for detecting an electromagnetic field.

BACKGROUND

A Rydberg atom is an atom with one or more electrons excited to a very high principal quantum number (e.g. >10). These Rydberg atoms have several useful properties, such as very large dipole moments and long decay periods.

The Rydberg atom may be used to detect an electromagnetic field. A Rydberg-atom based electromagnetic field detector is based on the Electromagnetically Induced Transparency (EIT) effect. The EIT effect may be experienced when a probe laser and a coupling laser are used to elevate electrons of an atomic medium to a Rydberg state. In this state, the atomic medium becomes transparent to the probe laser. An electromagnetic field incident at the atomic medium may then cause a further transition of an electron from the Rydberg state to a further Rydberg state. Electrons may subsequently drop from the further Rydberg state to the ground state so that the atomic medium becomes less transparent to the probe laser. The electromagnetic field may therefore be detected from this change in transparency as a change in intensity of the probe laser. Furthermore, the change in intensity is directly proportional to the incident electromagnetic field's amplitude, thus creating a Rydberg-atom based amplitude modulated receiver. Rydberg-atom based electromagnetic receivers have also been shown to detect frequency modulated and phase modulated electromagnetic fields.

Another form of Rydberg-atom based electromagnetic field detector utilises an interferometric technique in which the probe laser is split into a first and second path, in which the first path passes through the atomic medium and a second path does not pass through the atomic medium. A coupling laser also passes through the atomic medium to excite electrons to the Rydberg state. An incident electromagnetic field at the atomic medium causes a further transition of an electron from the Rydberg state to a further Rydberg state, which changes the refractive index of the atomic medium. The resultant change in optical path length difference between the first and second path is detectable as a change in intensity of the combined first and second paths of the probe signal.

Detection of an incident electromagnetic field at the photodetector, through either the absorption or interferometric techniques, requires the change in intensity of the probe laser to be detectable above the background signal.

It is desirable to improve the sensitivity of the Rydberg-atom based electromagnetic field detector.

SUMMARY OF THE INVENTION

According to a first aspect of the invention, there is provided a method of exciting a first transmission medium by a first probe signal at a first probe frequency, wherein the first probe signal excites electrons of the first transmission medium from a ground state of the first transmission medium to a first excited state of the first transmission medium; exciting the first transmission medium by a first coupling signal at a first coupling frequency, wherein the first coupling signal overlaps with the first probe signal in the first transmission medium and excites electrons of the first transmission medium to a predetermined excited state of the first transmission medium such that a first photon in the first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron from the further excited state of the first transmission medium; detecting the first photon in the first frequency range and having the first polarisation by detecting the first photon in the second frequency range; exciting a second transmission medium by a second probe signal at a second probe frequency, wherein the second probe signal excites electrons of the second transmission medium from a ground state of the second transmission medium to a first excited state of the second transmission medium; exciting the second transmission medium by a second coupling signal at a second coupling frequency, wherein the second coupling signal overlaps with the second probe signal in the second transmission medium and excites electrons of the second transmission medium to a predetermined excited state of the second transmission medium such that a second photon in the first frequency range incident upon the second transmission medium and having a second polarisation excites an electron in the predetermined excited state of the second transmission medium to a further excited state of the second transmission medium, wherein a second photon in the second frequency range is emitted as part of a subsequent deexcitation of the electron in the further excited state of the second transmission medium; and detecting the second photon in the first frequency range having the second polarisation by detecting the second photon in the second frequency range.

The method may further comprise the steps of: demodulating data based on detection of the first photon in the first frequency range having the first polarisation corresponding to a first bit value, and detection of the second photon in the first frequency range having the second polarisation corresponding to a second bit value.

The method may further comprise the step of: determining a cryptographic key based on the demodulated data.

According to a second aspect of the invention, there is provided a device for detecting a photon in a first frequency range, the detector comprising: a first transmission medium excitable by a first probe signal at a first probe frequency and an overlapping first coupling signal at a first coupling frequency, wherein the first probe frequency excites electrons of the first transmission medium from a ground state of the first transmission medium to a first excited state of the first transmission medium and the first coupling frequency excites electrons of the first transmission medium to a predetermined excited state of the first transmission medium such that a first photon in a first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron in the further excited state of the first transmission medium; a first detector configured to detect the first photon in the first frequency range having the first polarisation by detecting the first photon in the second frequency range; a second transmission medium excitable by a second probe signal at a second probe frequency and an overlapping second coupling signal at a second coupling frequency, wherein the second probe frequency excites electrons of the second transmission medium from a ground state of the second transmission medium to a first excited state of the second transmission medium, wherein the second coupling frequency excites electrons of the second transmission medium to a predetermined excited state of the second transmission medium such that a second photon in the first frequency range having a second polarisation incident upon the second transmission medium excites an electron in the predetermined excited state of the second transmission medium to a further excited state of the second transmission medium, wherein a second photon in the second frequency range is emitted as part of a subsequent deexcitation of the electron in the further excited state of the second transmission medium; and a second detector configured to detect the second photon in the first frequency range having the second polarisation by detecting the second photon in the second frequency range.

The device may further comprise: a housing configured to permit passage of the first photon in the first frequency range to the first transmission medium when arriving in a predetermined direction.

The device may further comprise: a processor configured to demodulate data based on detection of the first photon in the first frequency range having the first polarisation corresponding to a first bit value and detection of the second photon in the first frequency range having the second polarisation corresponding to a second bit value.

The processor may be further configured to determine a cryptographic key based on the demodulated data.

The first frequency range may be lower than the second frequency range. The first frequency range may be in the Radio Frequency (RF), microwave or infrared ranges of the electromagnetic spectrum.

According to a third aspect of the invention, there is provided a computer program comprising instructions to cause the device the second aspect of the invention to execute the steps of the method of the first aspect of the invention. The computer program may be stored on a computer readable carrier medium.

According to a fourth aspect of the invention, there is provided a system comprising: a first transmission medium excitable by a first probe signal at a first probe frequency and an overlapping first coupling signal at a first coupling frequency, wherein the first probe frequency excites electrons of the first transmission medium from a ground state of the first transmission medium to a first excited state of the first transmission medium and the first coupling frequency excites electrons of the first transmission medium to a predetermined excited state of the first transmission medium such that a first photon in a first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron in the further excited state of the first transmission medium; a first detector configured to detect the first photon in the first frequency range having the first polarisation by detecting the first photon in the second frequency range, a second transmission medium excitable by a second probe signal at a second probe frequency and an overlapping second coupling signal at a second coupling frequency, wherein the second probe frequency excites electrons of the second transmission medium from a ground state of the second transmission medium to a first excited state of the second transmission medium, wherein the second coupling frequency excites electrons of the second transmission medium to a predetermined excited state of the second transmission medium such that a second photon in the first frequency range and having a second polarisation incident upon the second transmission medium excites an electron in the predetermined excited state of the second transmission medium to a further excited state of the second transmission medium, wherein a second photon in the second frequency range is emitted as part of a subsequent deexcitation of the electron in the further excited state of the second transmission medium; and a second detector configured to detect the second photon in the first frequency range and having the second polarisation by detecting the second photon in the second frequency range.

BRIEF DESCRIPTION OF THE FIGURES

In order that the present invention may be better understood, embodiments thereof will now be described, by way of example only, with reference to the accompanying drawings in which.

DETAILED DESCRIPTION OF EMBODIMENTS

Figure 1:
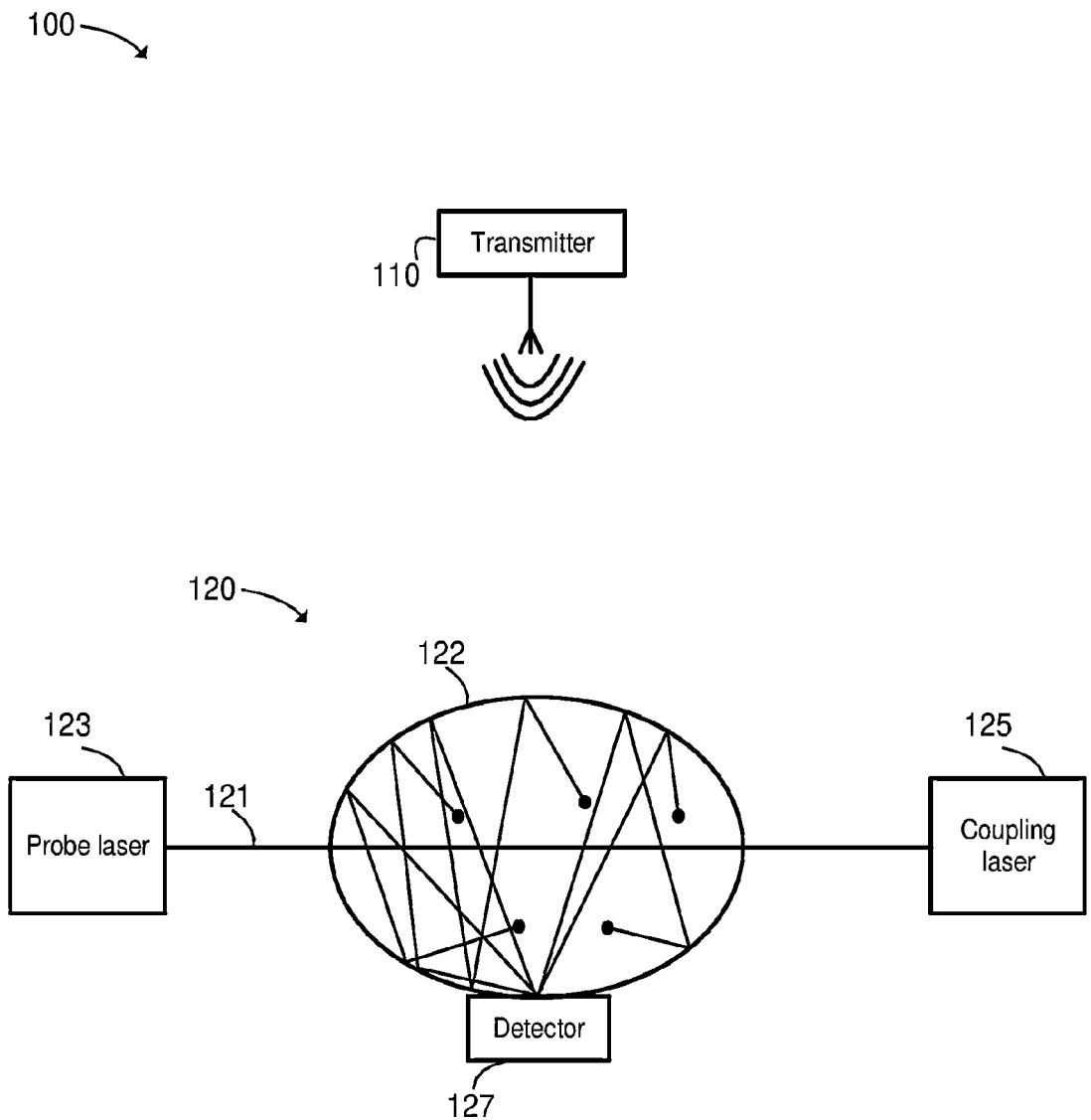
FIG. 1 is a schematic diagram of a wireless telecommunications network of a first embodiment of the present invention.

A first embodiment of a wireless telecommunications network 100 will now be described with reference to FIG. 1. The wireless telecommunications network 100 includes a wireless transmitter 110 and a Rydberg-atom based RF detector 120. In this embodiment, the wireless transmitter 110 is configured to transmit wireless signals at a frequency of 3.6 GHz. The Rydberg-atom based RF detector 120 includes an optical fibre 121, a probe laser 123, a coupling laser 125 and a detector 127. The optical fibre 121 includes a silica bulb 122 filled with a vapour of Rubidium-85 atoms.

The Rydberg-atom based RF detector 120 is configurable so as to excite electrons of the Rubidium-85 atoms contained within the silica bulb 122 to a predetermined Rydberg state. This is achieved by transmitting a probe signal by the probe laser 123 along the optical fibre 121 and through the silica bulb 122, and transmitting a counter-propagating coupling signal by the coupling laser 125 along the optical fibre 121 and through the silica bulb 122. The probe signal and coupling signal overlap in at least part of their respective passages through the silica bulb 122. The probe signal has a particular wavelength (780 nm) selected so as to excite electrons from a ground state to a first excited state, and the coupling signal has a particular wavelength (480 nm) so as to excite electrons from the first excited state to the predetermined Rydberg state. In this embodiment in which the Rydberg-atom based RF detector 120 is configured to detect a 3.6 GHz wireless signal transmitted by the wireless transmitter 110, the predetermined Rydberg state is the electron state having the $83^{rd}$ principal quantum number, $83D\_\{5/2\}$. In this configuration, wireless signals transmitted by the wireless transmitter at 3.6 GHz that pass through the silica bulb 122 of the optical fibre 121 will excite electrons from this predetermined Rydberg state ($83D\_\{5/2\}$) to a further Rydberg state ($84P\_\{3/2\}$).

The Rydberg-atom based RF detector 120 includes a controller (not shown) for controlling a frequency of the probe signal (i.e. to adjust or stabilise the frequency of the probe signal), for controlling a frequency of the coupling signal (i.e. to adjust or stabilise the frequency of the coupling signal), for controlling an intensity of the probe laser 123 (i.e. the transmission power and/or cross-sectional area of the probe laser 123), and for controlling an intensity of the coupling laser 125 (i.e. the transmission power and/or cross-sectional area of the coupling laser 125).

In this embodiment, the detector 127 is a single photon detector, such as a photomultiplier tube (PMT) (for example, as supplied by Hamamatsu Photonics) or a Single-Photon-Avalanche-Diode (SPAD). The controller 126 is also configured for controlling a spectral window of the detector 127 (that is, the range of frequencies within which the single-photon detector 127 may detect an individual photon). This spectral window is configured (e.g. by selecting a photocathode material of the PMT) to detect a photon (or photons) emitted in a decay path of an electron from the further Rydberg state to the ground state (described in more detail below). As the detector 127 is positioned in the vicinity of the atomic medium (so as to capture the photon emitted during the decay) then the Rydberg-atom based RF detector 120 includes a local power source to power the detector 127.

The interior surface of the silica bulb 122 is coated with a dielectric mirror coating (such as Hafnium Dioxide, as described in "High-reflectivity HfO2/SiO2 ultraviolet mirrors", Applied Optics, Vol. 41, Issue 16, pp. 3256-3261 (2002)). The coating is selected so as to have high reflectivity of a photon (or photons) emitted in a decay path from the further Rydberg state to the ground state (such as $>=99\%$ reflectivity in a range from 270 nm to 330 nm). The silica bulb 125 also includes a passage to the detector 127 so as to enable a photon within the silica bulb 122 to enter the detector 127.

Figure 2:
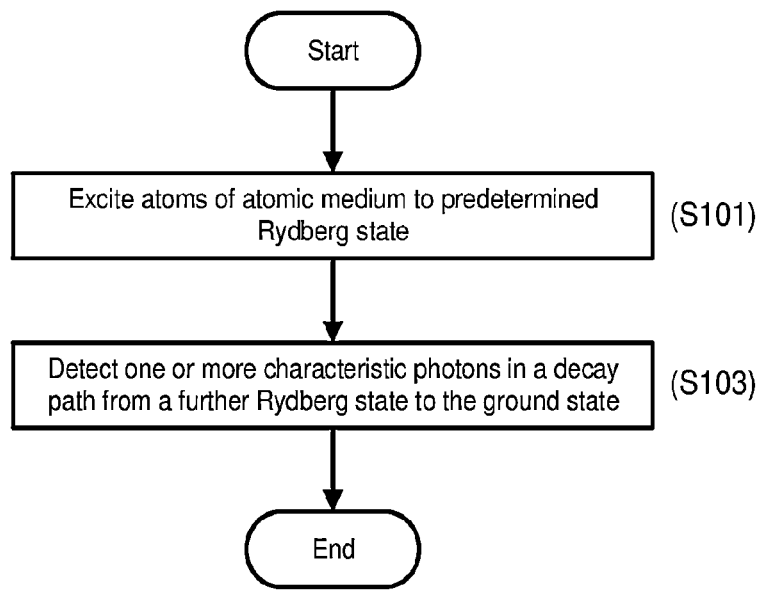
FIG. 2 is a flow diagram illustrating a method of the first embodiment of the present invention.

A first embodiment of a method of the present invention will now be described with reference to FIG. 2. In a first step (S101), the Rydberg-atom based RF detector 120 is operated so as to excite electrons of the Rubidium atoms in the silica bulb 122 to the predetermined Rydberg state. As noted above, this is achieved by passing the probe and coupling signals through the silica bulb 122 at their respective frequencies. A transition from this predetermined Rydberg state to the ground state is forbidden (or at least has a very long decay period). However, an electron may be further excited to the further Rydberg state by an RF signal transmitted by the wireless transmitter 110 at 3.6 GHz. Upon excitation by the RF signal, the electron will spontaneously decay to its ground state by a process of fluorescence. The most probable decay option is the decay directly to the ground state. The decay from the further Rydberg state directly to the ground state involves the fluorescent emission of a photon having a wavelength of 297.96 nm. This photon is within the spectral window of the detector 127. Other decay options from the further Rydberg state to the ground state are possible, such as via one or more intermediate states, wherein each decay between two states involves the fluorescent emission of a photon at a frequency corresponding with the energy difference between those two states. One or more of these characteristic photon frequencies are within the spectral window of the detector 127.

In step S103, the detector 127 detects one or more photons within its spectral window. In more detail, the detector 127 may detect a single photon having a frequency corresponding to the decay path from the further Rydberg state directly to the ground state, or of at least one of the two or more photons having frequencies corresponding to the difference in energy states in an indirect decay path from the further Rydberg state to the ground state via one or more intermediate states. Detection of these one or more characteristic photons is an indirect detection of a photon of the wireless signal transmitted by the wireless transmitter 110 that excited an electron from the predetermined Rydberg state to the further Rydberg state (as the transition to the ground state from the predetermined Rydberg state is forbidden and the coupling laser is centred on the transition to the predetermined Rydberg state and has a linewidth less than the spacing to the further Rydberg state). Therefore, detection of the characteristic photon implies that the electron has been excited—by the photon of the wireless signal transmitted by the wireless transmitter 110—from the predetermined Rydberg state to the further Rydberg state.

In other words, the Rydberg-atom based RF detector 120 is a single RF photon detector that indirectly detects the single RF photon by directly detecting one or more characteristic photons in a decay path from the further Rydberg state to the ground state. By enabling single-photon detection of a wireless signal transmitted by the wireless transmitter 110, the Rydberg-atom based RF detector 120 offers improved sensitivity than existing Rydberg-atom based RF detectors that rely on the absorption or interferometric detection techniques (which, as noted above, both require a sufficient number of photons to cause a detectable change in intensity of the probe signal above background noise). The Rydberg-atom based RF detector 120 exploits two properties to realise this benefit. Firstly, single-photon detection of the photons emitted during the decay from the further Rydberg state (that is, in the UV region of the electromagnetic spectrum) are available, whereas single photon detectors in the RF range of the electromagnetic spectrum are not; and, secondly, background noise for the single-photon detector for photons emitted during the decay from the further Rydberg state is much lower than background noise of existing Rydberg-atom based RF detectors (that rely on the absorption or interferometric techniques).

In this first embodiment, the reflective coating inside the silica bulb 122 ensures that any photon emitted in the decay path from the further Rydberg state to the ground state that does not directly enter the detector 127 is internally reflected into the detector 127 by one or more reflections.

Figure 3:
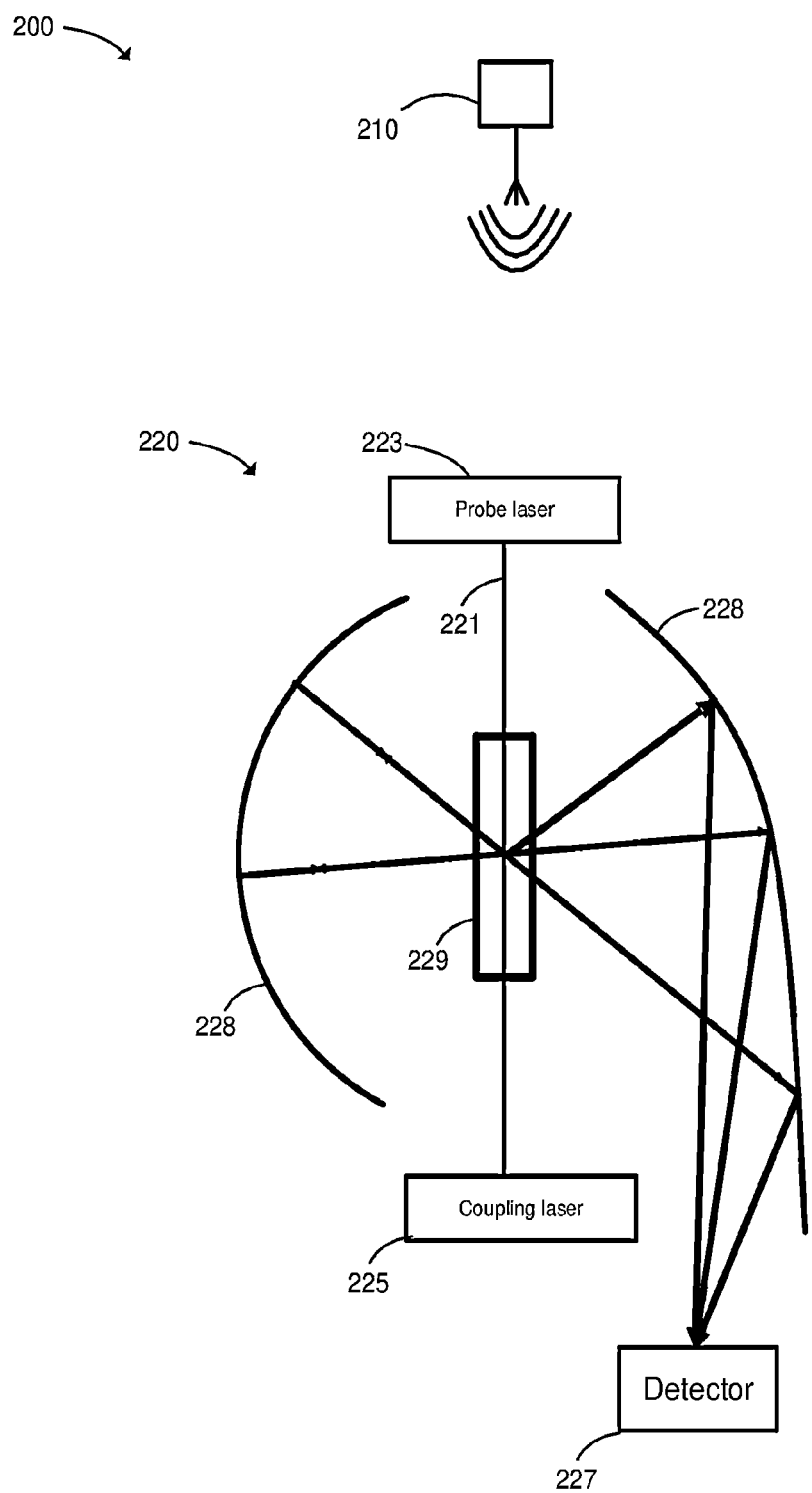
FIG. 3 is a schematic diagram of a wireless telecommunications network of a second embodiment of the present invention.

A second embodiment of a wireless telecommunications network 200 will now be described with reference to FIG. 3. The wireless telecommunications network 200 includes a wireless transmitter 210 and a Rydberg-atom based RF detector 220. In this second embodiment, the Rydberg-atom based RF detector 220 includes an optical fibre 221, a probe laser 223, a coupling laser 225, a detector 227, a housing 228, and a vapour cell 229.

The Rydberg-atom based RF detector 220 of this second embodiment is configured to transmit counter-propagating probe and coupling signals through the vapour cell 229 (which overlap during at least part of their respective passages of the vapour cell 229) so as to excite electrons of the Rubidium-85 atoms contained within the vapour cell 229 to a predetermined Rydberg state (i.e. 83D_{5/2}). In this configuration, wireless signals transmitted by the wireless transmitter 210 at 3.6 GHz that pass through the vapour cell 229 will excite electrons from this predetermined Rydberg state (83D_{5/2}) to a further Rydberg state (84P_{3/2}).

The vapour cell 229 is constructed out of a material (e.g. acrylic, silicone, quartz or silica) that is transparent to photons emitted in a decay path from the further Rydberg state to the ground state.

The housing 228 is configured to only allow wireless signals inside the housing 228 (and therefore pass through the vapour cell 229) that arrive in a particular direction. This is achieved, in this embodiment, by constructing the housing 228 from an insulating material that prevents passage of wireless signals at the frequency of the wireless signals transmitted by the wireless transmitter 210, and having one or more passageways in the housing 228 (e.g. an opening or a section constructed from a material that is transparent to wireless signals at the frequency used by the wireless transmitter 210) being positioned and aligned on a predetermined axis so as to only allow wireless signals inside the housing 228 that arrive in the particular direction.

The interior surface of the housing 228 is coated with a dielectric mirror coating (such as Hafnium Dioxide, as described above). The coating is selected so as to have high reflectivity (e.g. >=99% reflectivity) of a photon (or photons) emitted in a decay path from the further Rydberg state to the ground state. As shown in FIG. 3, the housing 228 is shaped so as to reflect photons passing out of the vapour cell 229 (that are emitted during a decay from the further Rydberg state to the ground state) to the detector 227. This shape may include a spherical section and a parabolic section so as to reflect the photons to the detector 227.

In this second embodiment, the detector 227 is again a single photon detector, such as a Single-Photon-Avalanche-Diode (SPAD) or photomultiplier tube (PMT) as described above. The spectral window of the detector 227 (that is, the range of frequencies within which the single-photon detector 227 may detect an individual photon) is configurable so as to detect a photon (or photons) emitted in a decay path of an electron from the further Rydberg state to the ground state. As the detector 227 is positioned in the vicinity of the atomic medium (so as to capture the photon emitted during the decay) then the Rydberg-atom based RF detector 220 again includes a local power source to power the detector 227.

The method of the first embodiment, as described above, may be applied to this second embodiment such that a single photon of the wireless signal transmitted by the wireless transmitter 210 in the RF region of the electromagnetic spectrum may be indirectly detected by the detector 227. In this second embodiment, a detection event is indicative of a single photon of a wireless signal arriving at the Rydberg-atom based RF detector 220 in a particular direction, corresponding with the axis of the passageway in the housing 228.

Figure 4:
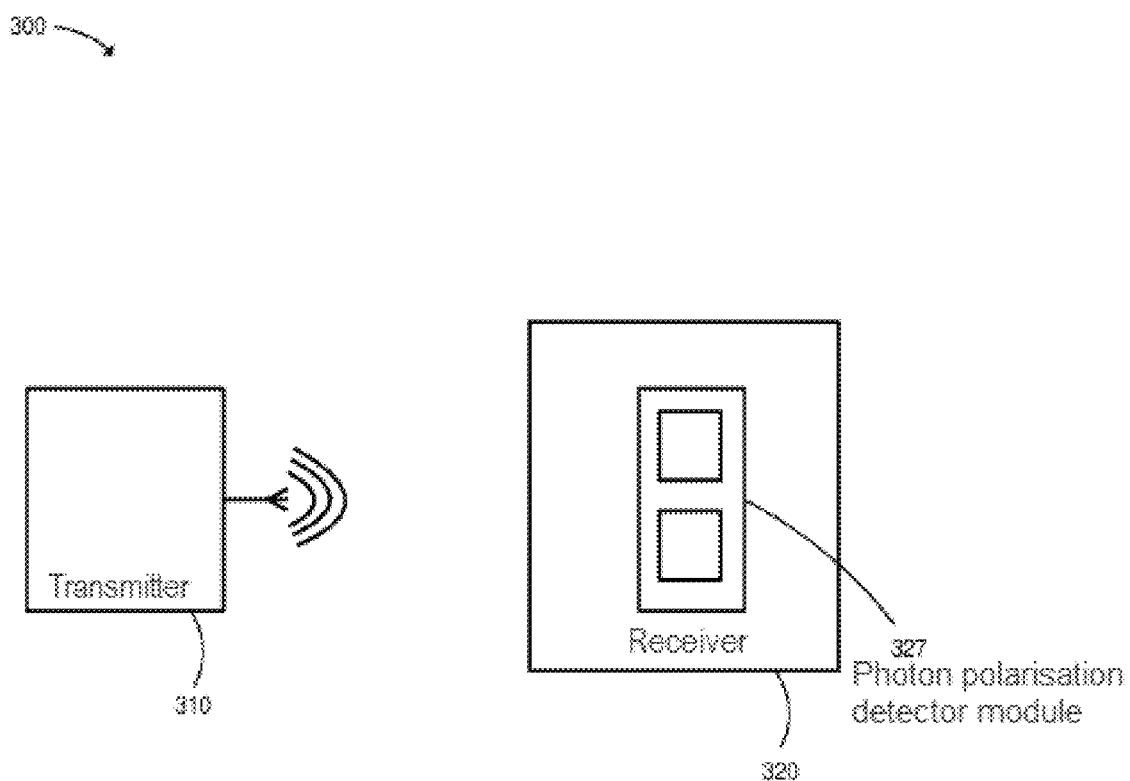
FIG. 4 is a schematic diagram of a wireless telecommunications network of a third embodiment of the present invention.

A third embodiment of the present invention will now be described with reference to FIG. 4. FIG. 4 illustrates an end-to-end Quantum Key Distribution (QKD) system 300 having a transmitter 310 and a receiver 320. The transmitter 310 is configured to transmit wireless signals (containing polarisation-encoded qubits, as described below) at 3.6 GHz. The receiver 320 includes a photon polarisation detector module 327. The photon polarisation detector module 327 includes a first and second Rydberg-atom based RF detector that are each based on the Rydberg-atom based RF detectors of the first or second embodiment above and are therefore configured to detect the 3.6 GHZ wireless signals transmitted by the transmitter 310.

The first and second Rydberg-atom based RF detectors include polarisation filters which only allow wireless signals having a particular polarisation to pass through the detector and excite the atomic medium. In a first state, the first Rydberg-atom based RF detector uses a first polarisation filter such that a wireless signal having the first polarisation (that is, 0 degrees) may pass through the first polarisation filter and through the atomic medium of the silica bulb/vapour cell (so as to cause a transition from the predetermined Rydberg state to the further Rydberg state), but a wireless signal having any other polarisation (including 45 degrees, 90 degrees or 135 degrees) may not pass through the first polarisation filter (and therefore does not pass through the atomic medium of the silica bulb/vapour cell which may otherwise cause a transition from the predetermined Rydberg state to the further Rydberg state). Furthermore, in the first state, the second Rydberg-atom based RF detector uses a second polarisation filter such that a wireless signal having a second polarisation (that is, 90 degrees) may pass through the second polarisation filter and through the atomic medium of the silica bulb/vapour cell (so as to cause a transition from the predetermined Rydberg state to the further Rydberg state), but a wireless signal having the any other polarisation (including 0 degrees, 45 degrees or 135 degrees) may not pass through the second polarisation filter (and therefore does not pass through the atomic medium of the silica bulb/vapour cell which may otherwise cause a transition from the predetermined Rydberg state to the further Rydberg state).

In a second state, the first Rydberg-atom based RF detector uses a third polarisation filter such that a wireless signal having a third polarisation (that is, 45 degrees) may pass through the third polarisation filter and through the atomic medium of the silica bulb/vapour cell (so as to cause a transition from the predetermined Rydberg state to the further Rydberg state), but a wireless signal having the any other polarisation (including 0 degrees, 90 degrees or 135 degrees) may not pass through the third polarisation filter (and therefore does not pass through the atomic medium of the silica bulb/vapour cell which may otherwise cause a transition from the predetermined Rydberg state to the further Rydberg state). Furthermore, in the second state, the second Rydberg-atom based RF detector uses a fourth polarisation filter such that a wireless signal having the fourth polarisation (that is, 135 degrees) may pass through the fourth polarisation filter and through the atomic medium of the silica bulb/vapour cell (so as to cause a transition from the predetermined Rydberg state to the further Rydberg state), but a wireless signal having the any other polarisation (including 0 degrees, 45 degrees or 90 degrees) will not pass through the fourth polarisation filter (and therefore does not pass through the atomic medium of the silica bulb/vapour cell which may otherwise cause a transition from the predetermined Rydberg state to the further Rydberg state).

In summary, the photon polarisation detector module 327 may switch between a first state, in which it is configured to detect 0 degree polarisation at the first Rydberg-atom based RF detector and detect 90 degree polarisation at the second Rydberg-atom based RF detector, and a second state, in which it is configured to detect 45 degree polarisation at the first Rydberg-atom based RF detector and detect 135 degree polarisation at the second Rydberg-atom based RF detector.

The QKD system 300 of this third embodiment utilises polarisation-encoded qubits to communicate an encryption (that is, cryptographic) key between the transmitter 310 and receiver 320. This may be based, for example, on the BB84 protocol, in which the transmitter 310 transmits qubits encoded according to a first base (in which a 0 degree polarisation corresponds to bit value 0 and a 90 degree polarisation corresponds to bit value 1) or second base (in which a 45 degree polarisation corresponds to bit value 0 and a 135 degree polarisation corresponds to bit value 1) to the receiver 320. The receiver 320 measures the qubits using either the first base (in which the photon polarisation detector module 327 is in the first state such that 0 degree polarisation qubits are detected at the first Rydberg-atom based RF detector and 90 degree polarisation qubits are detected at the second Rydberg-atom based RF detector) or the second base (in which the photon polarisation detector module 327 is in the second state such that 45 degree polarisation qubits are detected at the first Rydberg-atom based RF detector and 135 degree polarisation qubits are detected at the second Rydberg-atom based RF detector). Following measurement, the transmitter 310 and receiver 320 may communicate to determine which bases were used to transmit each qubit, such that the receiver 320 may identify the qubits that were successfully received. This protocol may be used to communicate the encryption key between the transmitter 310 and receiver 320.

The above third embodiment is arranged to distinguish between four different polarisations in order to implement a QKD protocol. In another embodiment, a receiver may comprise a first Rydberg-atom based RF receiver based on either the first or second embodiments above and configured to detect a first polarisation, and the receiver may further comprise a second Rydberg-atom based RF receiver based on the either the first or second embodiments above and configured to detect a second polarisation. The first and second polarisations may be perpendicular. This receiver may then be used to receive (that is, demodulate) data that is encoded by polarisation in a sequence of photons (for example, any photon having the first polarisation corresponds to bit value 0 and any photon having the second polarisation corresponds to bit value 1). In other words, this further embodiment may be used to communicate data of any form between the transmitter and receiver, and the QKD implementation of the third embodiment is just one example. The skilled person will also understand that other QKD implementations are possible utilising polarisation-encoded qubits using a plurality of Rydberg-atom based RF detectors—each configured to detect a particular polarisation.

In the third embodiment above, the Rydberg-atom based RF detectors were adapted to detect photons of a particular polarisation by using a polarisation filter. However, this is non-essential and the detectors may be configured to detect photons of a particular polarisation in other ways, such as by being excited by probe and coupling lasers having a particular polarisation.

In the above embodiments, the wireless signals transmitted to the Rydberg-atom based RF detectors have a frequency of 3.6 GHz and each photon excites an electron from the predetermined Rydberg state (83D_{5/2}) to a further Rydberg state (84P_{3/2}). As noted above, the subsequent decay from the further Rydberg state to the ground state involves the fluorescent emission of a photon at 297.96 nm, which is detectable using single-photon detectors. However, the Rydberg-atom based RF detectors may be configured to detect single photons at other frequencies using the same technique (that is, by detecting one or more characteristic photons emitted during decay to the ground state). For example, the predetermined Rydberg state may be selected (by configuration of the probe and coupling signals) at a relatively high quantum number, such as the Rb 149D_{5/2} state. An electron may then be excited from this predetermined Rydberg state to a further Rydberg state (Rb 150P_{3/2}) by an RF photon having a frequency of 605 MHz and the subsequent direct decay to the ground state involves the fluorescent emission of a photon at 296.86 nm, which is again detectable using single-photon detectors. In another example, the predetermined Rydberg state may instead be selected (by configuration of the probe and coupling signals) at a relatively low quantum number, such as Rb 6D_{5/2}. An electron may then be excited from this predetermined Rydberg state to a further Rydberg state (Rb 7P_3/2}) by an RF photon having a frequency of 24.6 THz and the subsequent direct decay to the ground state involves the fluorescent emission of a photon at 359 nm, which is again detectable using single-photon detectors. Accordingly, single-photon detectors operating in the range from 296 nm to 359 nm may be used to indirectly detect incoming photons in a range from 605 MHz to 24.6 THz. In other words, the Rydberg-atom based detectors may be used to indirectly detect photons having a relatively long wavelength (or relatively low frequency) by detecting characteristic photons emitted during decay to the ground state that have a relatively short wavelength (or relatively high frequency). The photons being indirectly detected may be in the RF, microwave and infrared ranges of the electromagnetic spectrum, and the photons being detected during decay to the ground state may be in the visible and ultraviolet ranges of the electromagnetic spectrum.

The embodiments above describe a ladder EIT effect using a probe signal and a coupling signal. However, the skilled person will understand that electrons may be elevated to a Rydberg state using any other form of EIT effect (e.g. lambda or Vee), and may use more than two signals. Furthermore, the skilled person will also understand that it is non-essential that the detectors use Rubidium-85 atoms, as other alkali metals, such as Caesium or Strontium, may be used instead.

In the description above, the photon of the wireless signal to be detected excites an electron of the Rydberg-atom from a predetermined Rydberg state to another Rydberg state. This covers a first scenario in which the wireless signal has a signal strength less than a threshold such that the predetermined Rydberg state and the other Rydberg state are not split following interaction with the wireless signal, and a second scenario in which the wireless signal has signal strength greater than a threshold so as to split the predetermined Rydberg state and the other Rydberg state following interaction with the wireless signal. In the first scenario, the photon of the wireless signal excites an electron from the predetermined Rydberg state to the other Rydberg state (as described extensively above). In the second scenario, the predetermined Rydberg state is split in two (which may be denoted R1−d and R1+d) and the other Rydberg state is split in two (which may be denoted R2−d and R2+d). The enables four transitions (R1−d→R2−d, R1−d>R2+d, R1+d→R2−d, and R1+d→R2+d). Furthermore, if the two states are split equally, then there are three distinct energy differences for these four transitions (R2−R1−2d, R2−R1, and R2−R1+2d), which is known as a Stark triplet. The photon of the wireless signal may then excite an electron via any one of these transitions (that is, from either of the predetermined Rydberg split-states to either of the other Rydberg split-states), and subsequently deexcite as described above.

As noted above, the single-photon detector in each embodiment may be configured with a spectral window to capture one or more of the characteristic photons of a decay path from the further Rydberg state to the ground state. The direct decay from the further Rydberg state to the ground state is the most probable transition, but there is typically a probability distribution of transitions from any specific further Rydberg state to the ground state, which involve the emission of one or more characteristic photons. Detection of at least one of these characteristic photons is deemed an indirect detection of an RF photon at the Rydberg-atom based RF detector.

The skilled person will understand that any combination of features is possible within the scope of the invention, as claimed.

The invention claimed is:

1. A method of detecting a photon in a first frequency range, the method comprising the steps of:
    exciting a first transmission medium by a first probe signal at a first probe frequency, wherein the first probe signal excites electrons of the first transmission medium from a ground state of the first transmission medium to a first excited state of the first transmission medium;
    exciting the first transmission medium by a first coupling signal at a first coupling frequency, wherein the first coupling signal overlaps with the first probe signal in the first transmission medium and excites the electrons of the first transmission medium to a predetermined excited state of the first transmission medium such that a first photon in the first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron from the further excited state of the first transmission medium;
    detecting the first photon in the first frequency range and having the first polarisation by detecting the first photon in the second frequency range;
    exciting a second transmission medium by a second probe signal at a second probe frequency, wherein the second probe signal excites electrons of the second transmission medium from a ground state of the second transmission medium to a first excited state of the second transmission medium;
    exciting the second transmission medium by a second coupling signal at a second coupling frequency, wherein the second coupling signal overlaps with the second probe signal in the second transmission medium and excites the electrons of the second transmission medium to a predetermined excited state of the second transmission medium such that a second photon in the first frequency range incident upon the second transmission medium and having a second polarisation excites an electron in the predetermined excited state of the second transmission medium to a further excited state of the second transmission medium, wherein a second photon in the second frequency range is emitted as part of a subsequent deexcitation of the electron in the further excited state of the second transmission medium; and
    detecting the second photon in the first frequency range having the second polarisation by detecting the second photon in the second frequency range.

2. The method as claimed in claim 1, wherein the method further comprises the steps of:
    demodulating data based on detection of the first photon in the first frequency range having the first polarisation corresponding to a first bit value, and detection of the second photon in the first frequency range having the second polarisation corresponding to a second bit value.

3. The method as claimed in claim 2, further comprising the step of:
    determining a cryptographic key based on the demodulated data.

4. The method as claimed in claim 1, wherein the first frequency range is lower than the second frequency range.

5. The method as claimed in claim 1, wherein the first frequency range is in the Radio Frequency (RF), microwave or infrared ranges of the electromagnetic spectrum.

6. A non-transitory computer readable carrier medium storing a computer program, which upon execution by a computer, causes the steps of the method of claim 1 to be performed.

7. A device for detecting a photon in a first frequency range, the detector comprising:
    a first transmission medium excitable by a first probe signal at a first probe frequency and an overlapping first coupling signal at a first coupling frequency, wherein the first probe frequency excites electrons of the first transmission medium from a ground state of the first transmission medium to a first excited state of the first transmission medium and the first coupling frequency excites the electrons of the first transmission medium to a predetermined excited state of the first transmission medium such that a first photon in a first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron in the further excited state of the first transmission medium;
    a first detector configured to detect the first photon in the first frequency range having the first polarisation by detecting the first photon in the second frequency range;
    a second transmission medium excitable by a second probe signal at a second probe frequency and an overlapping second coupling signal at a second coupling frequency, wherein the second probe frequency excites electrons of the second transmission medium from a ground state of the second transmission medium to a first excited state of the second transmission medium, wherein the second coupling frequency excites the electrons of the second transmission medium to a predetermined excited state of the second transmission medium such that a second photon in the first frequency range having a second polarisation incident upon the second transmission medium excites an electron in the predetermined excited state of the second transmission medium to a further excited state of the second transmission medium, wherein a second photon in the second frequency range is emitted as part of a subsequent deexcitation of the electron in the further excited state of the second transmission medium; and
    a second detector configured to detect the second photon in the first frequency range having the second polarisation by detecting the second photon in the second frequency range.

8. The device as claimed in claim 7, further comprising:
a housing configured to permit passage of the first photon in the first frequency range to the first transmission medium when arriving in a predetermined direction.

9. The device as claimed in claim 7, further comprising:
a processor configured to demodulate data based on detection of the first photon in the first frequency range having the first polarisation corresponding to a first bit value and detection of the second photon in the first frequency range having the second polarisation corresponding to a second bit value.

10. The device as claimed in claim 9, wherein the processor is further configured to determine a cryptographic key based on the demodulated data.

11. The device as claimed in claim 7, wherein the first frequency range is lower than the second frequency range.

12. The device as claimed in claim 7, wherein the first frequency range is in the Radio Frequency (RF), microwave or infrared ranges of the electromagnetic spectrum.

13. A system comprising:
a first transmission medium excitable by a first probe signal at a first probe frequency and an overlapping first coupling signal at a first coupling frequency, wherein the first probe frequency excites electrons of the first transmission medium from a ground state of the first transmission medium to a first excited state of the first transmission medium and the first coupling frequency excites the electrons of the first transmission medium to a predetermined excited state of the first transmission medium such that a first photon in a first frequency range and having a first polarisation incident upon the first transmission medium excites an electron in the predetermined excited state of the first transmission medium to a further excited state of the first transmission medium, wherein a first photon in a second frequency range is emitted as part of a subsequent deexcitation of the electron in the further excited state of the first transmission medium;

a first detector configured to detect the first photon in the first frequency range and having the first polarisation by detecting the first photon in the second frequency range;

a second transmission medium excitable by a second probe signal at a second probe frequency and an overlapping second coupling signal at a second coupling frequency, wherein the second probe frequency excites electrons of the second transmission medium from a ground state of the second transmission medium to a first excited state of the second transmission medium, wherein the second coupling frequency excites the electrons of the second transmission medium to a predetermined excited state of the second transmission medium such that a second photon in the first frequency range and having a second polarisation incident upon the second transmission medium excites an electron in the predetermined excited state of the second transmission medium to a further excited state of the second transmission medium, wherein a second photon in the second frequency range is emitted as part of a subsequent deexcitation of the electron in the further excited state of the second transmission medium; and a second detector configured to detect the second photon in the first frequency range and having the second polarisation by detecting the second photon in the second frequency range.

* * * * *